(12) United States Patent
Adomi et al.

(10) Patent No.: US 6,759,689 B2
(45) Date of Patent: Jul. 6, 2004

(54) LIGHT EMITTING ELEMENT AND METHOD FOR MANUFACTURING THE SAME

(75) Inventors: Keizo Adomi, Annaka (JP); Masanobu Takahashi, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/213,081

(22) Filed: Aug. 7, 2002

(65) Prior Publication Data

US 2004/0026703 A1 Feb. 12, 2004

(51) Int. Cl.[7] ............................................ H01L 33/00
(52) U.S. Cl. ........................................ 257/98; 257/99
(58) Field of Search .................................. 257/98, 99

(56) References Cited

U.S. PATENT DOCUMENTS

| | | | | |
|---|---|---|---|---|
| 4,990,970 | A | * 2/1991 | Fuller | 257/98 |
| 6,429,463 | B1 | * 8/2002 | Mauk | 257/98 |
| 6,492,661 | B1 | * 12/2002 | Chien et al. | 257/98 |
| 6,563,141 | B1 | * 5/2003 | Dawson et al. | 257/98 |

FOREIGN PATENT DOCUMENTS

| JP | 2001-339100 | 12/2001 |
|---|---|---|
| JP | 7-66455 | 3/2002 |

OTHER PUBLICATIONS

R.H. Horng et al., AlGaInP light–emitting diodes with mirror substrates fabricated by wafer bonding, Applied Physics Letters, Nov. 15, 1999, pp. 3054–3056, vol. 75, No. 20, American Institute of Physics, U.S.A.

I. Schnitzer et al., 30% external quantum efficiency from surface textured, thin–film light–emitting diodes, Applied Physics Letters, Oct. 18, 1993, pp. 2174–2176, vol. 63, No. 16, American Institute of Physics, U.S.A.

* cited by examiner

*Primary Examiner*—Jerome Jackson
(74) *Attorney, Agent, or Firm*—Ronald R. Snider; Snider & Associates (57) ABSTRACT

A metal layer 3, a light emitting layer section 4 and a first electrode 5 are formed in the order on a first main surface 7 side of a conductive substrate 2 and a current is supplied to the light emitting layer section 4 through the first electrode 5 and the conductive substrate 2. By using reflection on the metal layer 3, not only can good external quantum efficiency be realized, but electrodes or terminals can also be formed on both sides of the light emitting element. Thus, provided is a light emitting element excellent in external quantum efficiency thereof and in addition, not only simple in structure of a terminal lead thereof but excellent in convenience.

13 Claims, 12 Drawing Sheets

Prior Art

FIG. 15

Prior Art

LIGHT EMITTING ELEMENT AND METHOD FOR MANUFACTURING THE SAME

FIELD OF THE INVENTION

The present invention relates to a light emitting element and a method for manufacturing the same.

DESCRIPTION OF THE BACKGROUND ART

Materials used in light emitting elements such as a light emitting diode and a semiconductor laser and element structures thereof have been technically progressed for many years and as a result, an internal quantum efficiency in the interior of the element has been gradually closer to a theoretical limit. Thereto, in order to obtain an element with a higher luminance, an external quantum efficiency of the element is a very important factor. As for a method for improving the external quantum efficiency, there has been proposed a method in which a light transparent semiconductor substrate is bonded with the light emitting layer section so that light directed to the substrate side from the light emitting layer section can contribute to light emission. However in a case where a light transparent semiconductor substrate is bonded directly with a light emitting layer section, there arises a problem since a process therefor is generally apt to become complex and the light emitting layer section is subject to deterioration due to a necessary bonding treatment at a high temperature.

A light emitting element having a light emitting layer section made of AlGaInP mixed crystal adopts a double heterostructure in which a thin AlGaInP (or GaInP) active layer is sandwiched by an n type AlGaInP cladding layer and a p type AlGaInP cladding layer, each having a bandgap larger than the active layer, thereby enabling a high luminance element to be realized. Such an AlGaInP double heterostructure can be formed by growing layers made of AlGaInP mixed crystals epitaxially on a GaAs single crystal substrate using lattice-matching between AlGaInP mixed crystal and GaAs. In a case where the double heterostructure is used as a light emitting element, generally, a GaAs single crystal substrate is also in many cases used as an element substrate as it is. However, since AlGaInP layer mixed crystal or a light emitting layer section is larger in band gap than GaAs, there is a drawback that emitted light is absorbed in the GaAs substrate to cause a sufficient external quantum efficiency to be difficult to obtain. While in order to solve this problem, a method is proposed (for example, in JP A 95-66455) in which a reflective layer made of multiple semiconductor layers is inserted between a substrate and a light emitting element, a great improvement on external quantum efficiency cannot be expected in consideration of a principle since differences in refractive index between stacked semiconductor layers are used, and so only light with a limited angle range of incidence is reflected.

Figure 14:
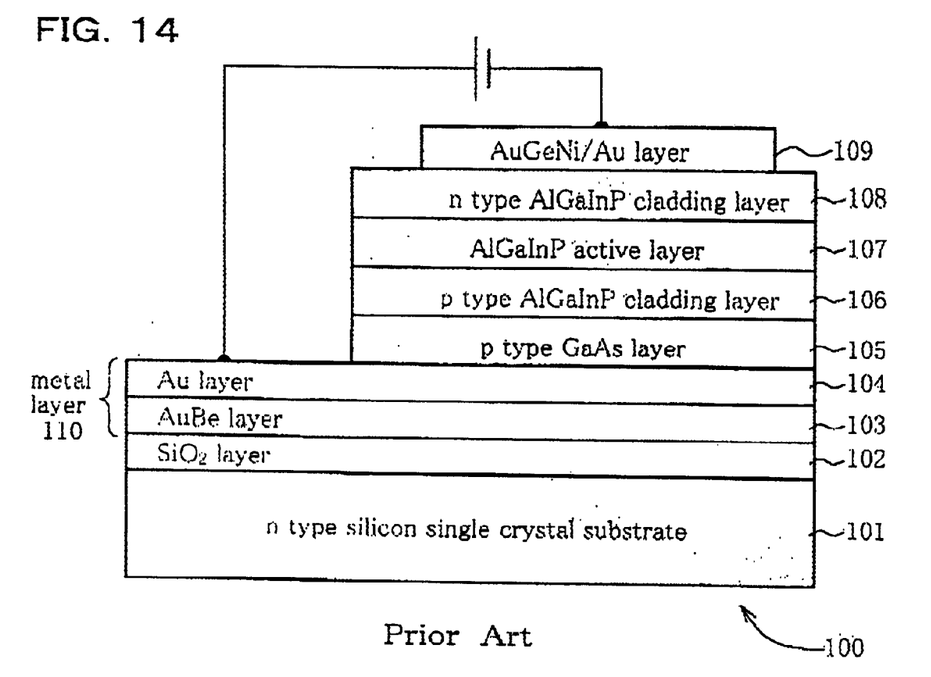
FIG. 14 is a model diagram showing a structure of a prior art light emitting element.
Figure 15:
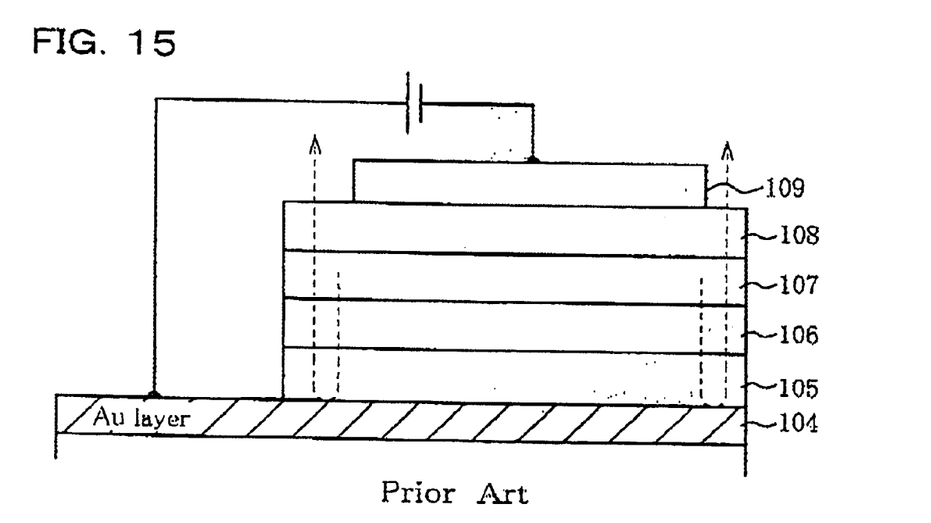
FIG. 15 is a model diagram showing a reflection route of light in the light emitting element of FIG. 14.

On the other hand, according to a very recently issued literature (Applied Physics Letters, 75 (1999) 3054), a proposal is made on a structure in which a metal layer made of mainly Au is inserted between an light emitting layer section having an AlGaInP double heterostructure and a silicon single crystal substrate as shown in FIG. 14. To be concrete, a light emitting element 100 shown in FIG. 14 has a structure in which an AuBe layer 103 and an Au layer 104 are formed as a metal layer 110 on an $SiO_2$ layer 102 formed by oxidizing an n type silicon single crystal substrate 101; and thereon, further, a p type GaAs cap layer 105, a p type AlGaInP cladding layer 106, an AlGaInP active layer 107 and an n type AlGaInP cladding layer 108 forming a double heterostructure; and an electrode 109 made of an AuGeNi/Au layer are formed in the order. Light generated in the active layer 107 is reflected on the Au layer 104 as shown in FIG. 15.

With this structure adopted, since the metal layer 110 serves as a reflective mirror, a high reflectance not dependent on an incidence angle can be obtained thereby enabling an external quantum efficiency to be enhanced to a great extent. In this case, however, since the AlGaInP mixed crystal layer cannot be grown directly on the metal layer, the following method is adopted. The process goes this way: The silicon single crystal substrate 101 on which the metal layer 110 is formed by vapor deposition and a GaAs single crystal substrate on which a light emitting layer section including the AlGaInP double heterostructure 106, 107 and 108, and the GaAs cap layer 105 is epitaxially grown are separately prepared. Then, both substrates are bonded between the metal layer 110 and the cap layer 105 and thereafter, the GaAs single crystal substrate is removed, followed by forming the necessary electrodes to complete an element.

In the element disclosed in the above literature, a silicon single crystal substrate 101 on which the metal layer 110 is formed is covered with a thick insulating film 102 made of SiO; and as shown in FIG. 14 current supply to the cap layer 105 and the light emitting layer sections 106 to 108 is performed between the Au layer 104 and the electrode 109 using a portion exposed on the outer side of the Au layer 104 and a portion exposed on the outer side of the cap layer 105 and the light emitting layer sections 106 to 108 as electrodes, but not through the insulating film 102. Therefore, in this structure, a fault arises that a structure of a terminal lead of the element inevitably results in complexity, which in turn, leads to increase in man hours in manufacture and then to a higher cost of an element.

SUMMARY OF THE INVENTION

It is an object of the present invention to provide an light emitting element excellent in external quantum efficiency thereof and in addition, not only simple in structure of a terminal lead thereof but excellent in convenience; and a method for manufacturing the same.

In order to solve the above problems, a light emitting element of the present invention comprises a conductive substrate, a metal layer, a light emitting layer section and a first electrode, wherein the metal layer, the light emitting layer section and the first electrode are formed in the order on a first main surface side of a conductive substrate and a current can be supplied to the light emitting layer section through the first electrode and the conductive substrate.

According to the above structure, since the metal layer is inserted between the substrate and the light emitting layer section, a reflection on the metal layer can be used, thereby enabling not only a good external quantum efficiency to be realized, but electrodes or terminals to be formed on both sides of the light emitting element. That is, dissimilar to the light emitting element of the above literature (FIG. 14), no necessity arises for adopting a complex structure that the metal layer is exposed on the side of the light emitting layer section to form a terminal lead section. Therefore, a structure of a terminal lead of an element is greatly simplified, thereby enabling downsizing a chip of a light emitting element, but also realization thereof excellent in convenience.

Figure 1A:
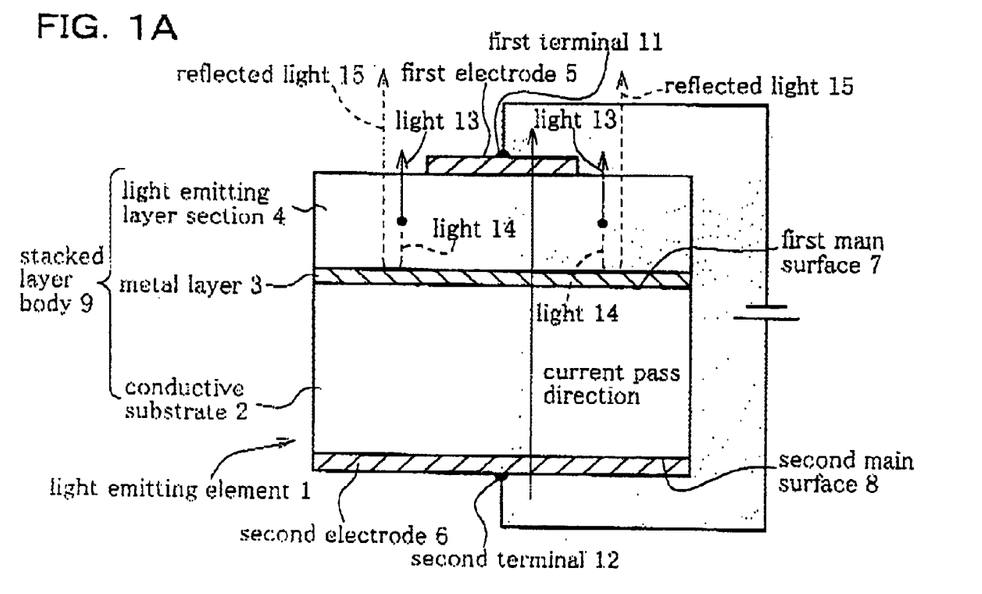
FIGS. 1A and 1B are model diagrams showing examples of simplified structures of light emitting elements of the present invention.
Figure 1B:
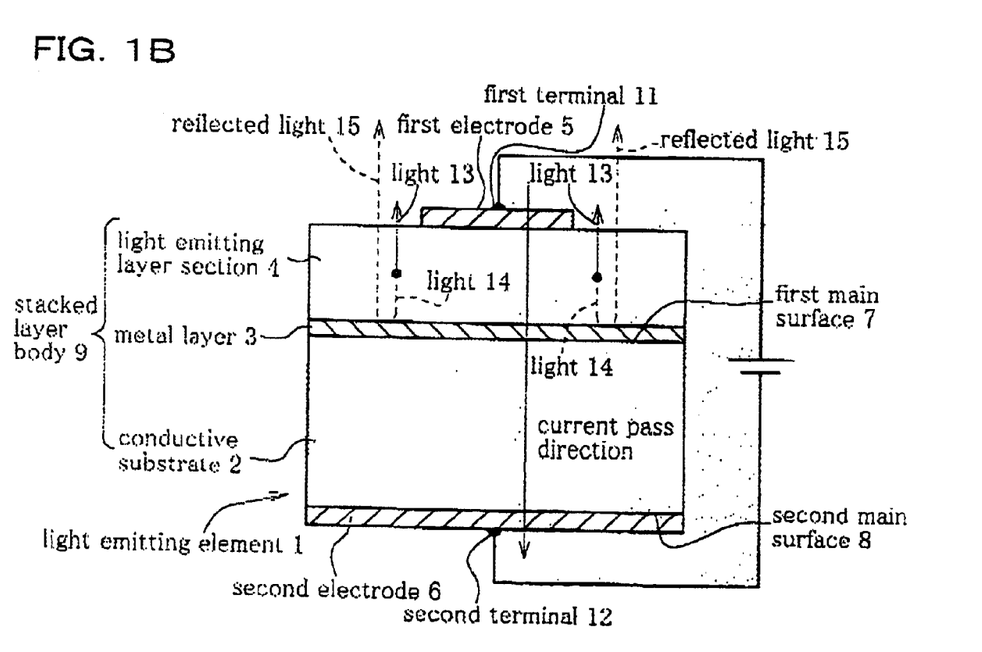

A direction of current through a stacked layer body 9 constructed of a conductive substrate 2, a metal layer 3 and a light emitting layer section 4 can be any of a direction with which a first electrode side has a negative polarity as shown in FIG. 1A and a direction with which the first electrode side has a positive polarity as shown in FIG. 1B. In this case, the order of stacked layers in a heterojunction structure of the light emitting layer section 4 is reversed between the structures of FIGS. 1A and 1B.

The conductive substrate 2 can be made of a semiconductor such as silicon single crystal and also of a metal such as Al. In a case where the conductive substrate 2 is made of semiconductor, as shown in FIGS. 1A and 1B, a second electrode 6 is formed on a second main surface side of the conductive substrate 2 and a second terminal 12 is further formed on the second electrode 6. In this case, a current flows between the first electrode 5 and the second electrode 6. On the other hand, in a case where the conductive substrate 2 is made of a metal, since the second terminal 12 can be formed directly in the conductive substrate 2, the second electrode 6 can be omitted. Note that in a case where a semiconductor is adopted as a material of the conductive substrate 2, a structure is desirably adopted that the conductive substrate 2 and the metal layer 3 are put into direct contact with each other from the view points of current supply through the conductive substrate 2 without any trouble and enhancement of a bonding strength between the metal layer 3 and the conductive layer 2.

The first electrode 5 can be formed so as to cover only a part of the surface of the light emitting layer section 4. In this case, it is possible that of light beams 13 and 14 generated in the active layer of the light emitting layer section 4, at least a part of the light beam 14 directed to the metal layer 3 is reflected on the metal layer 3 and the reflected light 15 is leaked out through a region that is not covered with the first electrode 5 on the surface of the light emitting layer section, thereby, enabling better external quantum efficiency to be realized.

The above light emitting element 1 can be manufactured by superimposing the conductive substrate 2 and the light emitting layer section 4 on each other between bonding surfaces thereof with only the metal layer 3 interposed therebetween to apply a bonding treatment to the superimposed structure for manufacture.

To be concrete, the above light emitting element 1 can be manufactured according to a manufacturing method of the present invention. That is, a method for manufacturing a light emitting diode comprises the steps of; growing the light emitting layer section 4 epitaxially on a semiconductor single crystal substrate; bonding a first main surface of the conductive substrate 2 and a first main surface of the light emitting layer section 4 to each other with only the metal layer 3 interposed therebetween; and separating or removing the semiconductor single crystal substrate, wherein the steps are performed in the order. The bonding treatment can be, for example, a bonding treatment by heating.

In the above method, the conductive substrate 2 and the light emitting layer section 4 are bonded to each other with only the metal layer 3 interposed therebetween. Dissimilar to the above literature, by bonding the conductive substrate 2 and the light emitting layer section 4 to each other with only the metal layer 3 interposed therebetween, but without interposing an insulating film such as $SiO_2$ or the like, not only can a bonding strength be strengthened but a good electrical conductive state between the conducive substrate 2 and the metal layer 3 can also secured. Especially, in a case where the conductive substrate 2 is made of silicon single crystal, compound semiconductor single crystal or mixed crystal, a higher boding strength can be assured of the substrate and part of the metal layer are bonded to form alloy.

DETAILED DESCRIPTION OF THE PREFERRED EMBODIMENTS

Description will be given of embodiments of the present invention with reference to the accompanying drawings.

FIG. 1A is a conceptual diagram showing a light emitting element 1, which is an embodiment of the present invention. The light emitting element 1 includes: a metal layer 3, a light emitting layer section 4 and a first electrode b formed in the order on a first main surface 9 side of a conductive substrate 2. The first electrode 5 is formed in such a way to cover only part of a surface of the light emitting layer section 4. Furthermore, a second electrode 6 is formed on a second main surface 8 side of the conductive substrate 2 and a current supply to the light emitting layer section 4 is performed between the first electrode 5 and the second electrode 6 with the light emitting layer section 4 and the metal layer 3 interposed therebetween (that is through the first electrode 5 and the conductive substrate 2).

Figure 2:
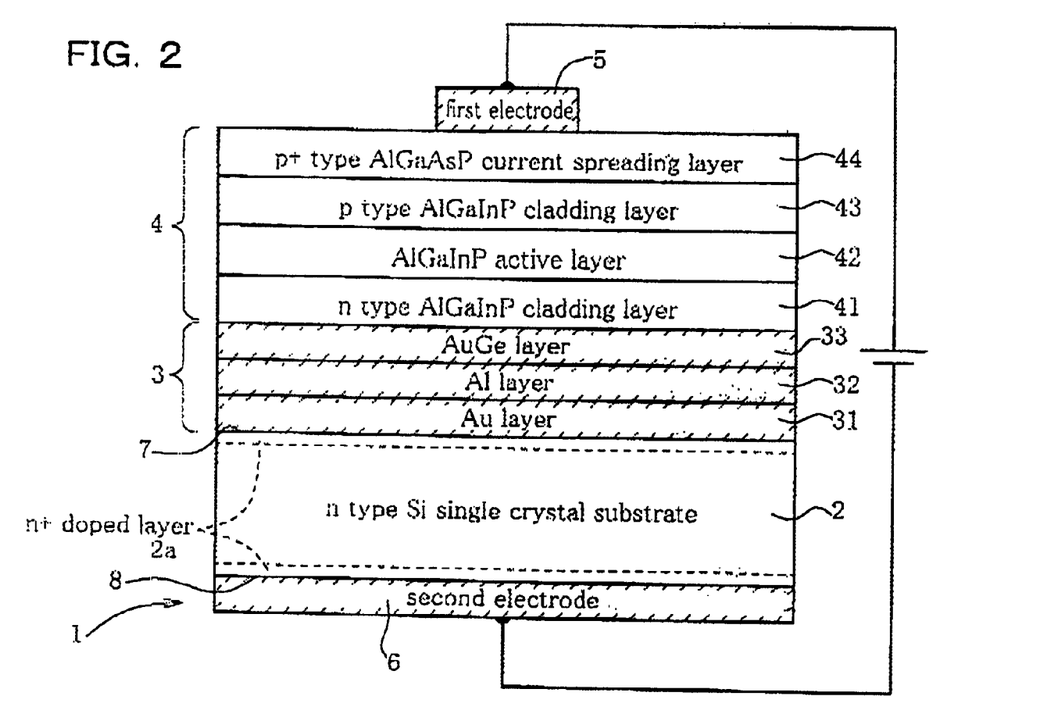
FIG. 2 is a model diagram showing an example of concrete stacked layer structure of the light emitting element of FIG. 1A.

FIG. 2 shows a more detailed structure of the light emitting element 1. The conductive substrate 2 is an n type Si (silicon) single crystal substrate, and the metal layer 3 includes: a first metal layer 31 formed in contact with the Si single crystal substrate 2; an intermediate metal layer 32 in contact with the first metal layer 31 on the light emitting layer section 4 side; and a second metal layer 33 formed in contact with the light emitting layer section 4. The Si single crustal substrate 2 is hard to be deformed due to a thermal stress and others even in a case of heat bonding described later and further easy to form an alloy with some specific metals (for example Au); therefore, an advantage is enjoyed that a bonding structure with a high strength is easy to be realized. In this case, by forming the first metal layer 31 with a metal whose metal component as a main component is easier to be alloyed with Si than a metal component as a main component of the intermediate metal layer 32, alloying between the metal layer 3 and the Si single crystal substrate 2 can be restricted so as to occur within the first metal layer 31 while suppressing progress of alloying into the intermediate metal layer 32. With such a consideration given, increase is realized in an area fraction of the metal phase on a junction interface between the metal layer 3 and the light emitting layer section 4, thereby enabling sustenance of a good flatness on the junction interface. Any of the above effects contributes to improvement of reflectance on the junction interface.

In this case, the first metal layer 31 can be made of a metal whose metal component as a main component has a lower eutectic temperature of a solid solution with Si than a metal component as a main component of the intermediate metal layer 32. With the first metal layer 31 having a main component that forms an eutectic at a comparatively low temperature between silicon having a high melting point adopted, a heat bonding temperature can be lower, which can produce a state where degradation of the light emitting layer 4 or other inconveniences occurs only with difficulty. As a concrete example, the first metal layer 31 can be made of an Au layer or an AuGe alloy (for example, with a Ge content of the order of 12 wt %) layer including Au as a main component and the intermediate metal layer 32 can be made of an Al layer or an Al alloy layer including Al as a main component. An eutectic temperature of a solid solution of Au and Si is about 363° C. and a eutectic temperature of a solid solution of Al and Si is about 557° C. Note that it is desirable to form the intermediate metal layer 32 with a metal whose metal component as a main component forms, with the lowest chance, an eutectic having a low melting point with Au from the view point of realization of difficulty in exerting an influence of alloying between the intermediate metal layer 32 and the Si single crystal substrate 2 on the intermediate metal layer 32. Al is desirable as a main component of the intermediate metal layer 32 in this respect. In addition to Al, as a candidate component that can be adopted, there can be exemplified: Ag, Cu, Ni, Pd, Pt or the like.

Note that, the Si single crystal substrate 2 desirably adopts a structure in which high concentration doped layers 2a are formed at the first and second main surface sides (for example, a double sided diffusion wafer obtained by thermal diffusion to a high dopant concentration) in order to enhance ohmic contact with the metal layer 3 and the second electrode 6. Alternatively, a substrate doped with, for example, As or B to a high concentration can be used as the Si single crystal substrate 2. In this embodiment, there is adopted an n type Si single crystal substrate 2 having n type doped layers 2a at respective both surfaces thereof.

Then, in this embodiment, there is formed the second metal layer 33 in contact with the n type AlGaInP cladding layer 41, reflecting light from the light emitting layer section between the intermediate metal layer 32 and the light emitting layer section 4.

As a material of the second metal layer 33, there can be exemplified a layer made of a metal including Au as a main component. In this embodiment, the second metal layer 33 is formed with an Au—Ge alloy. A Ge content in the Au—Ge alloy in use is preferably in the range of from 1 to 3 mass %. Furthermore, the second metal layer 33 can also be an Au layer.

Then, the light emitting layer section 4 can have a double heterostructure layer including: a first conductive type cladding layer 43 located in the first electrode 5 side; a second conductivity type cladding layer 41 located in the metal layer 3 side; and an active layer 42 formed between the first conductivity type cladding layer 43 and the second conductivity type cladding layer 41. With such structure adopted, holes and electrons injected from both cladding layers 43 and 41 are recombined with good efficiency in a situation where the holes and electrons are confined in a narrow space within the active layer 42, thereby enabling realization of an element with a high luminance. Note that in order to enhance an external quantum efficiency due to reflection, the second conductivity type cladding layer 41 and the metal layer 3 are preferably formed in direct contact with each other. In order to lower an operating voltage, however, a thin film doped at a high concentration can be inserted between the second conductivity type cladding layer 41 and the metal layer 3.

A double heterostructure layer can be made of, to be concrete, AlGaInP mixed crystal. To be more concrete, a structure can be adopted in which the active layer 42 made of AlGaInP mixed crystal or GaInP mixed crystal is sandwiched by the p type AlGaInP cladding layer 43 and the n type AlGaInP cladding layer 41. An AlGaInP is of a direct transition type and a semiconductor having a large bandgap, and injected holes and electrons are confined within the narrow active layer 42 due to energy barriers caused by bandgap differences from the cladding layers 43 and 41 formed on both sides of the active layer 42 so as to efficiently recombine, thereby enabling realization of a very high emission efficiency. Furthermore, by adjusting a composition of the active layer 42, emission wavelengths can be created over a wide range from a green region to a red region. In the light emitting element 1 of FIG. 2, the p type AlGeInP cladding layer 43 is disposed in the first electrode 5 side and a polarity in current supply is to be positive in the first electrode 5 side.

Then, a current spreading layer 44 of the same conductivity type as that of the first conductivity type cladding layer 43 is formed between the first electrode 5 and the first conductivity type cladding layer 43. Since the first electrode 5 is formed so as to cover only part of a surface of the light emitting layer section 4, current can be diffused so as to be uniform laterally over the double heterostructure layer 41, 42 and 43 with the help of the current spreading layer 44 formed, thereby enabling a high luminance emission state over a region not covered with the first electrode 5. As a result, intensities of not only a direct light in the region but also reflected light by the metal layer 3 are enhanced and thus enhanced light can be efficiently taken out without obstruction by the first electrode 5, thereby enabling enhancement of emission luminance from the element as a whole.

The current spreading layer 44 can be made of either AlGaAs mixed crystal or AlGaAsP mixed crystal. Since the AlGaAs mixed crystal of the AlGaAsP mixed crystal has a small difference in lattice constant from GaAs and a degree of lattice matching with a GaAs single crystal substrate is high, good lattice matching can be advantageously ensured when an AlGaInP mixed crystal is epitaxially grown thereon. In the embodiment of FIG. 2, the current spreading layer 44 is formed with p$^+$ type AlGaAsP mixed crystal doped with an impurity to a high concentration.

Note that in the light emitting element 1 of FIG. 2, the following numerical values can be exemplified as an actual example of thickness values of the respective layers: 200 nm for the first metal layer 31, 100 nm for the intermediate metal layer 32; 200 nm for the second metal layer 33; 1000 nm for the n type AlGaInP cladding layer 41, 600 nm for the AlGaInP active layer 42, 1000 nm for the p type AlGaInP cladding layer 43 and 1000 nm for the p$^+$ type AlGaAsP current spreading layer 44. Furthermore, for example, the first electrode 5 can be made of an Au layer and an AuBe layer, the second electrode 6 can be made of a Ni layer and thickness values thereof can be set on the order of 1000 nm.

Figure 3:
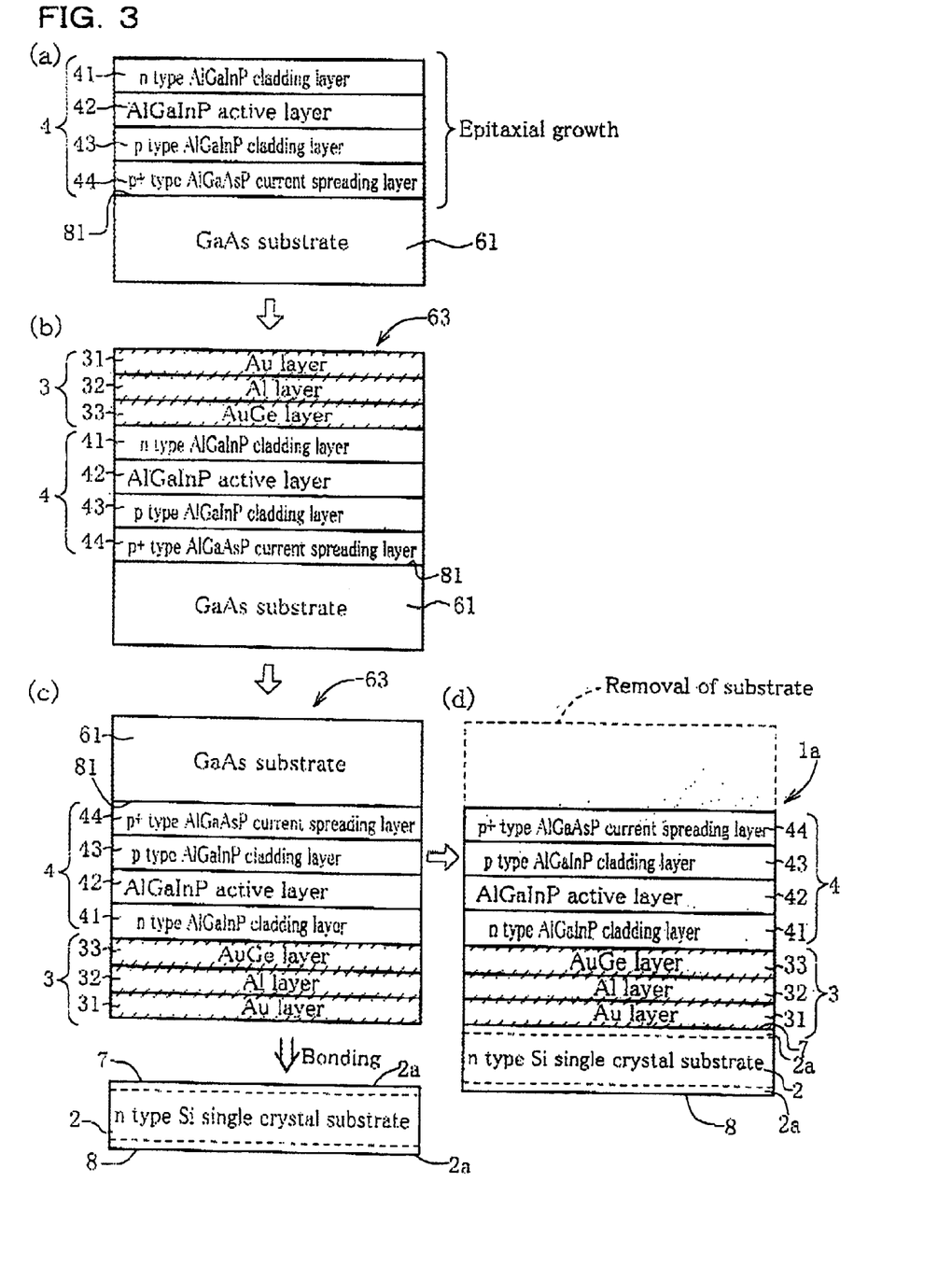
FIGS. 3(a) to 3(d) are descriptive diagrams showing a first example of a manufacturing process of the light emitting element of FIG. 2.

Description will be given of a method for manufacturing the light emitting element 1 of FIGS. 1A and 1B below:

First, as shown in FIG. 3(a), the p$^+$ type AlGaAsP current spreading layer 44, the p type AlGaInP cladding layer 43, the AlGaInP active layer 42, and the n type AlGaInP cladding layer 41 are epitaxially grown in the order as the light emitting layer section 4 on a first main surface 81 of a GaAs single crystal substrate 61, which is a semiconductor single crystal substrate. The epitaxial growth of the layers can be performed by means of a metalorganic vapor phase epitaxy (MOVPE) method.

Then, as shown in FIG. 3(b), the AuGe layer (the second metal layer) 33, the Al layer (the intermediate metal layer) 32 and the Au layer (the first metal layer) 31 are formed in the order as the metal layer 3 on the n type AlGaInP cladding layer 41 of the light emitting layer section 4. Formation of the layers can be effected by means of a publicly known physical vapor deposition method, for example a vacuum vapor deposition method, a sputtering method or the like. Then, a multilayer substrate 63 including the metal layer 3 thus having been formed is superimposed on the Si single crystal substrate 2 between the metal layer 3 side and the first main surface 7 of the single crystal substrate 2 (FIG. 3(c)) and thereafter, the superimposed substrates are heated at a temperature in the range of 300° C. to 500° C. to thus perform a bonding treatment. Heating is performed in, for example, a nitrogen atmosphere. By doing so, the Au layer 31 is bonded to the main surface 7 of the Si single crystal substrate 2. The bonding treatment is preferably performed at a temperature a little higher than, for example, the Au—Si eutectic temperature (for example, a little higher or lower than the range of 370° C. to 400° C.).

At the above bonding treatment temperature, part of the Au layer 31 on the whole thereof is subjected to an eutectic reaction with Si of the Si single crystal substrate 2 in the bonding to form an Au—Si alloy layer. A composition of the formed Au—Si alloy is, for example, 2 to 6 mass % Si and the balance of Au. On the other hand, Al of the Al layer 32 forms intermetallic compounds of various compositions with Au and any of the intermetallic compounds produces no liquid phase from an eutectic reaction at a temperature in the range of 300° C. to 500° C. as a bonding temperature; therefore, alloying with Au is comparatively hard to occur. As a result, an influence of alloying between the Au layer 31 and Si in the boding treatment is hard to act on the Au—Ge layer 33 of the second metal layer 33, thereby enabling enhancement of light reflecting capability of the Au—Ge layer 33.

Figure 5:
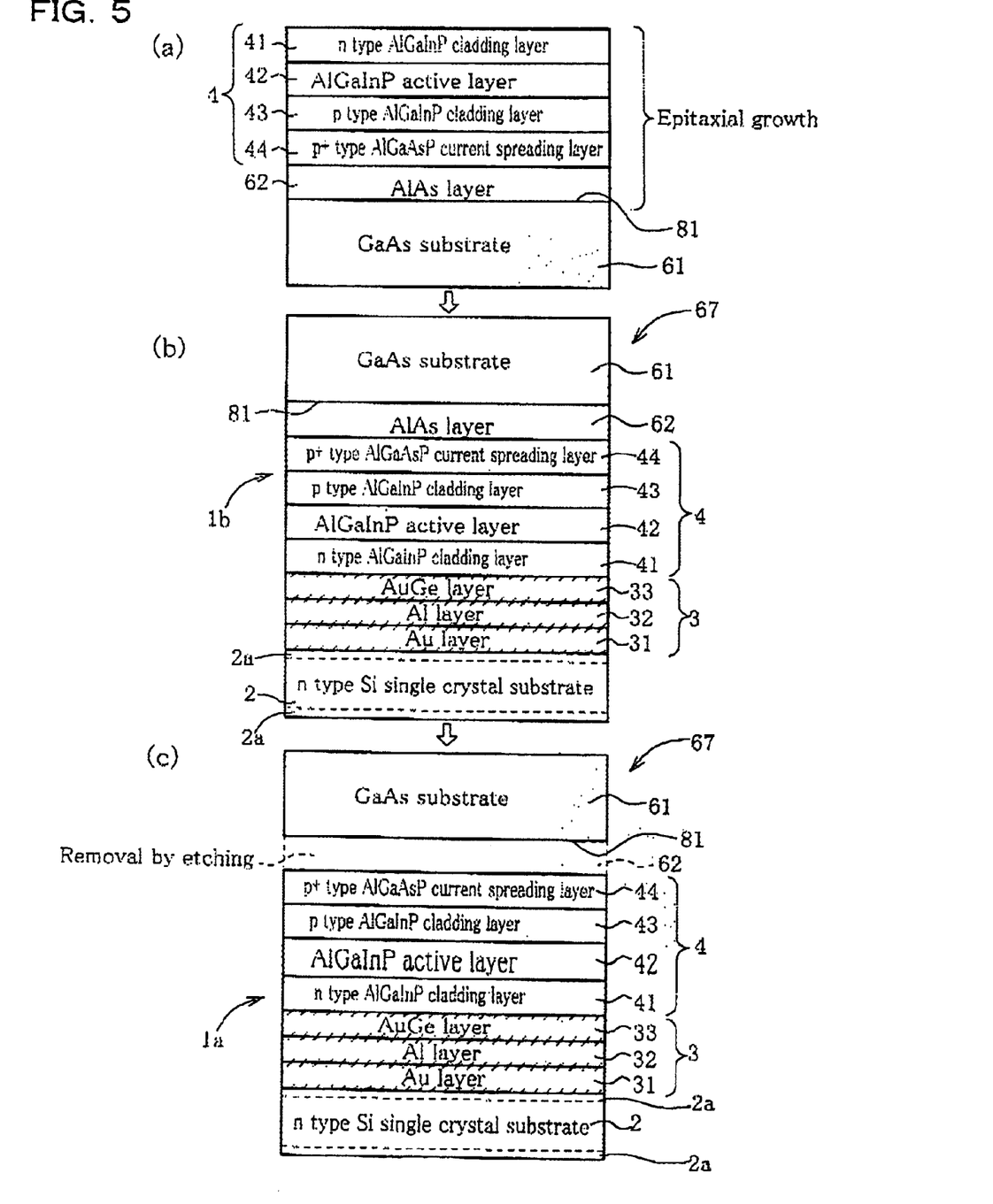
FIGS. 5(a) to 5(c) are descriptive diagrams showing a third example of the manufacturing process.

When the bonding treatment ends, as shown in FIG. 3(c), the GaAs single crystal substrate 61 is removed, thereby obtaining a light emitting element substrate 1a of a multilayer structure. Removal of the GaAs single crystal substrate 61 can be performed by, for example, chemical etching. On the other hand, a process may be adopted in which as shown in FIG. 5(a), a separation growth layer 62 is formed in advance between the light emitting layer section 4 and the GaAs single crystal substrate 61 as a semiconductor single crystal substrate and after the light emitting layer section 4 is bonded to the Si single crystal substrate 2, which is a conductive substrate, with the metal layer 3 interposed therebetween as shown in FIG. 5(b), the separation growth layer 62 is selectively removed, as shown in FIG. 5(c), thereby enabling separation of the light emitting layer section 4 from the GaAs single crystal substrate 61. In this case, the separation growth layer 62 can be epitaxially grown on the GaAs single crystal substrate 61 and is desirably made of a material higher in solubility in a specific etching liquid than the light emitting layer section 4.

For example, in a case where the current spreading layer 44 is made of AlGaAs mixed crystal, the separation growth layer 62 can be made of AlAs single crystal layer. In this case, a solution of sulfuric acid/hydrogen peroxide (H$_2$SO$_4$/H$_2$O$_2$/H$_2$O) is preferably used as an etching liquid. The etching liquid shows almost no corrosiveness to AlGaAs mixed crystal of the current spreading layer 44 or AlGaInP mixed crystals of the double heterostructure layer 41, 42, and 43, whereas it shows a conspicuous corrosiveness to an AlAs single crystal layer. Therefore, by immersing the multilayer bonded substrate 67 formed including the separation growth layer 62 into the etching liquid, the separation growth layer 62 is selectively dissolved and removed, thereby enabling separation of the GaAs single crystal substrate 61 with ease.

The first electrode 5 is formed on the current spreading layer 44 side of the light emitting element substrate 1a without the GaAs single crystal substrate 61, having been removed and separated from the multilayer bonded substrate, the second electrode 6 is formed on the second main surface 8 side of the Si single crystal substrate 2, followed by dicing, thereafter the semiconductor chips are fixed on supports, and further, lead lines are wire-bonded thereon and resin-encapsulation is performed, thereby obtaining the light emitting element 1 shown in FIG. 2.

Figure 4:
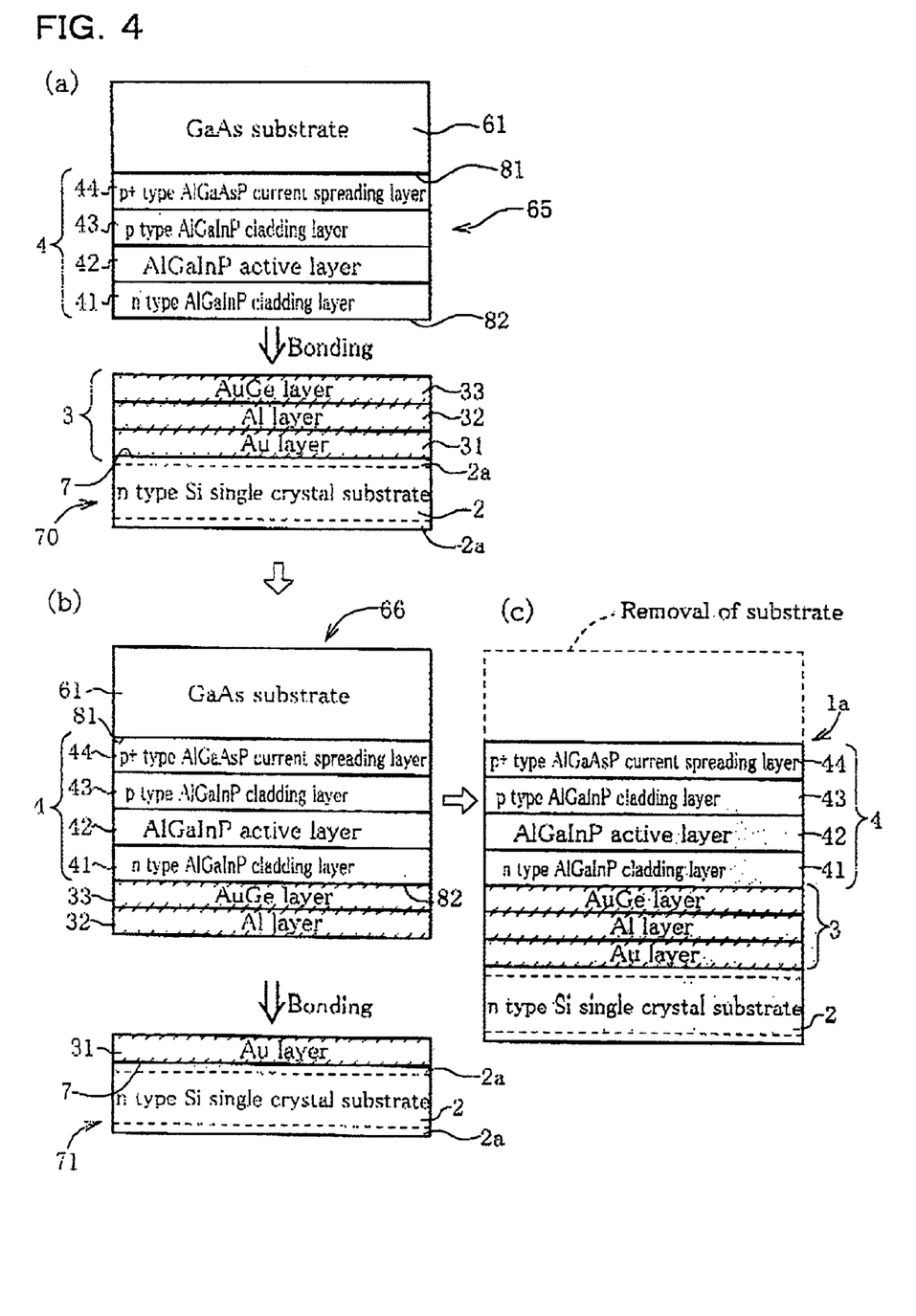
FIGS. 4(a) to 4(c) are descriptive diagrams showing a second example of the manufacturing process.

In the bonding treatment in the embodiment shown in FIGS. 3(a) to 3(d), the metal layer 3 formed in contact with a first main surface side of the light emitting layer section 4 is bonded to the first main surface 7 of the conductor substrate 2. On the other hand, the bonding treatment may be performed in a way that as shown in FIG. 4(a), the metal layer 3 formed in contact with the first main surface 7 of the conductive substrate 2 is bonded to the first main surface 82 side of the light emitting layer section 4. In this embodiment, the Au layer 31, the Al layer 32 and the AuGe layer 33 are in advance stacked in the order as the metal layer 3 on the first main surface 7 of the Si single crystal substrate 2 and the metal layer 3 is put into direct contact with the first main surface 82 of the light emitting layer section 4 to heat, thereby completing the bonding treatment.

Furthermore, the bonding treatment can also be, as shown in FIG. 4(b), performed in a way that the metal layers 32 and 33 formed in contact with the first main surface 82 of the light emitting layer section 4 are bonded with the metal layer 31 formed in contact with the first main surface 7 of the Si single crystal substrate 2, which is a conductive substrate. In the embodiment shown in the figure, a bonding interface is formed between the Al layer 32 serving as the intermediate layer and the Au layer 31 serving as the first metal layer. For example, at a bonding temperature, Au of the Au layer 31 and Si of the Si single crystal substrate 2 react with each other to generate at eutectic melt and to cause the eutectic melt to be in wet contact with the Al layer 32, thereby enabling a good bonded state to be obtained.

Figure 6:
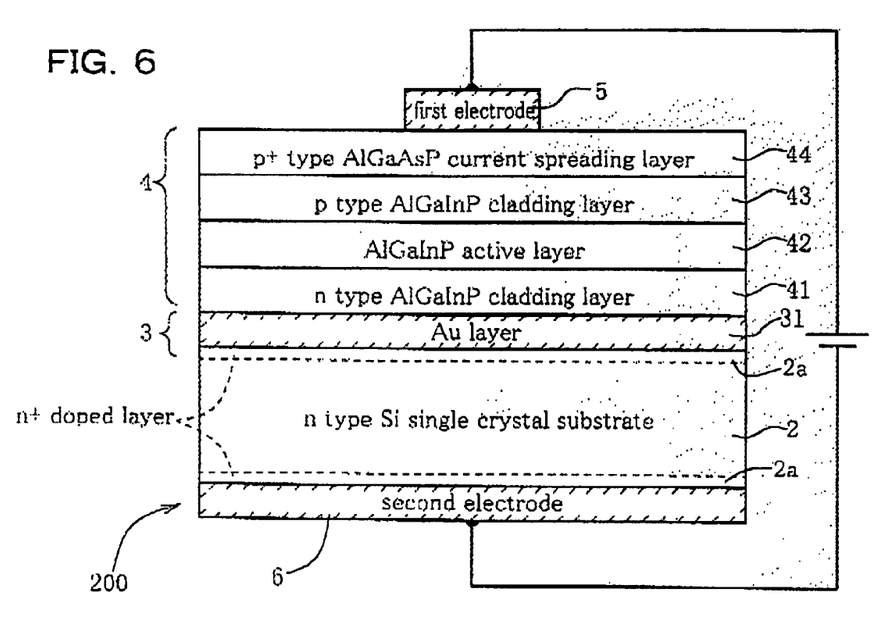
FIG. 6 is a model diagram showing a first example modification of a metal layer at the light emitting element of FIG. 2.
Figure 7:
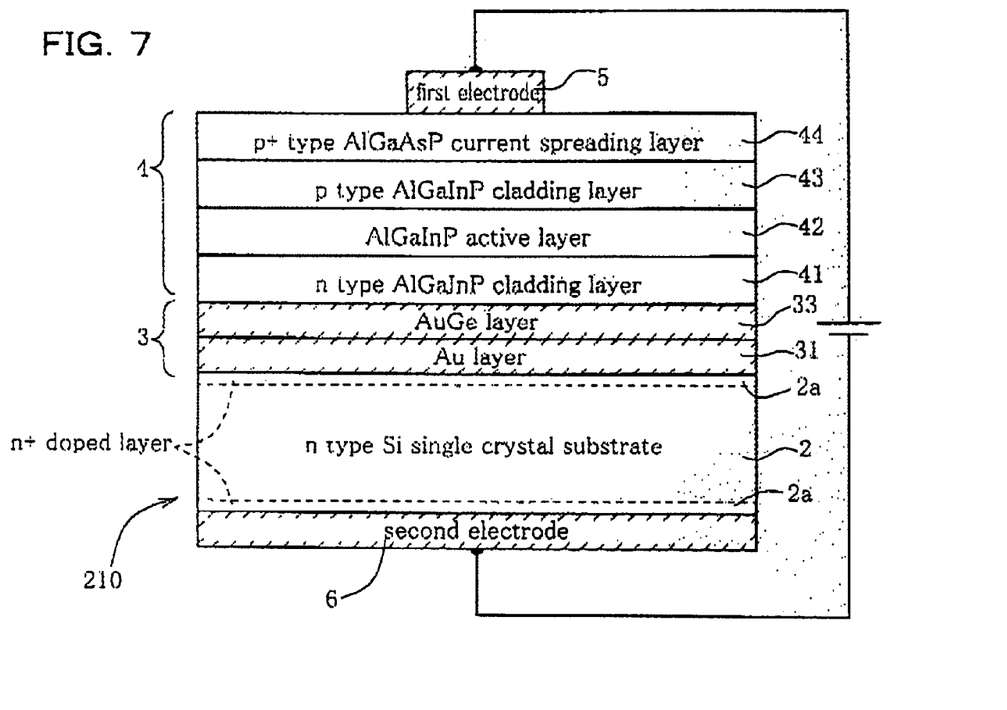
FIG. 7 is a model diagram showing a second example modification of the metal layer.

Note that as shown in FIG. 6 and FIG. 7, various modifications can be tried on a structure of the metal layer 3. In a light emitting element 200 of FIG. 6, the metal layer 3 is made of only the Au layer 33. The Au layer 33, however, is at least partly transformed into an Au—Si alloy. A light emitting element 210 of FIG. 7 is an example in which the metal layer 3 is of a two layer structure; the AuGe alloy layer 33 located in the light emitting layer section 4 side and the Au layer 31 located in the Si single crystal substrate 2 side. In any of the cases, a treatment temperature is preferably set to a temperature in the vicinity of the eutectic temperature of a solid solution if Si—Au or to a temperature a little lower than a temperature in the vicinity thereof, for the bonding treatment.

Figure 11:
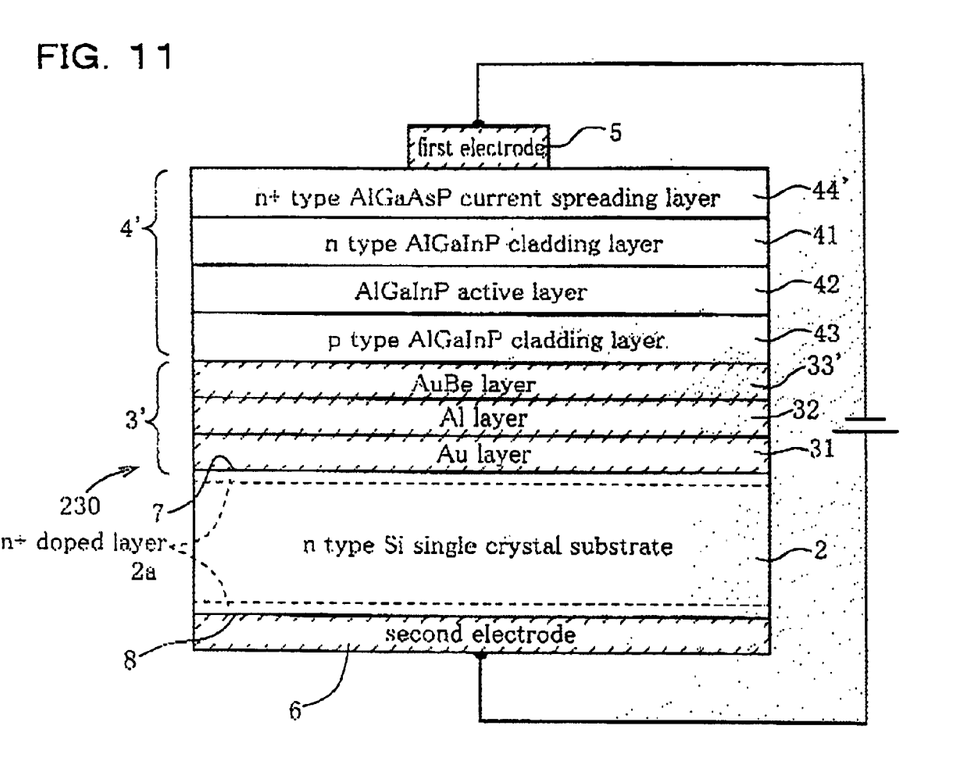
FIG. 11 is a model diagram showing an example of a light emitting element having a cladding layer and a current spreading layer in a first electrode side of the n type.

While, in each of the light emitting elements 1, 200 and 210 of respective FIGS. 2, 6 and 7, there is shown an example in which the first conductivity cladding layer and the current spreading layer are both or the p type, a structure is also enabled as shown in FIG. 11 in which the first conductivity cladding layer and the current spreading layer are both of the n type. In the light emitting element 230, the Au layer (the first metal layer) 31, the Al layer (the intermediate metal layer) 32 and the AuBe layer (the second metal layer) 33' are formed in the order as the metal layer 3' on the first main surface 7 of the Si single crystal substrate 2. Furthermore, a light emitting layer section 4' is constructed from the p type AlGaInP cladding layer 43, the AlGaInP active layer 42, the n type AlGaInP cladding layer 41 and the n$^+$ type AlGaAs current spreading layer 44' in the order starting from the metal layer 3' side. The stacking order of the layers 41, 42, and 43 of the light emitting element 230 is inversion of the light emitting element 1 of FIGS. 1A and 1B and a current polarity is negative on the first electrode 5 side.

Figure 9:
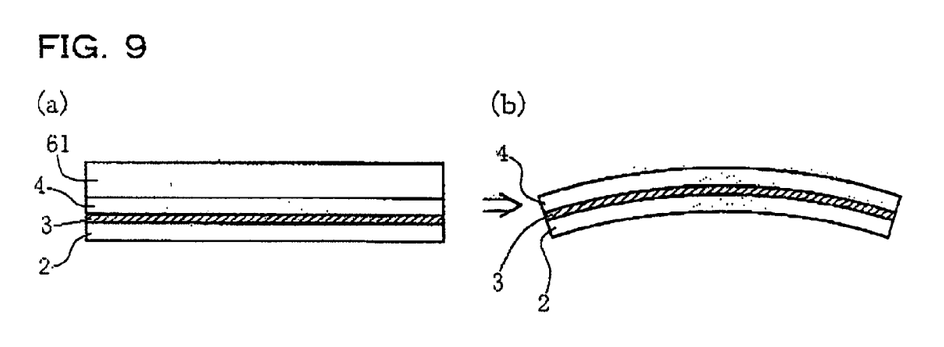
FIGS. 9(a) and 9(b) are diagrams describing a way that a bow on a light emitting element substrate occurs by removing a semiconductor single crystal substrate after bonding.
Figure 10A:
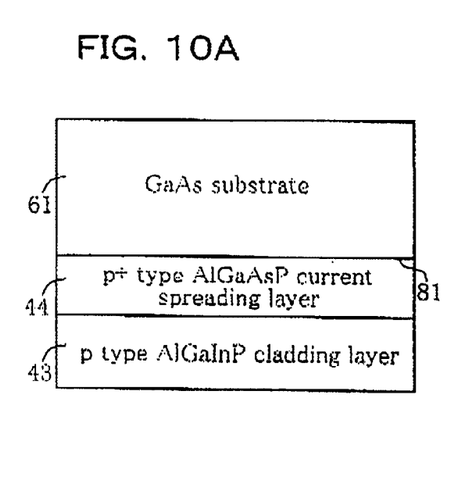
FIGS. 10A and 10B are diagrams describing a difference in thickness according to whether a conductivity type of a current spreading layer is p or n.

An advantage from adoption of the structure is as follows: That is, as shown in FIG. 9, if a composite obtained by growing the light emitting layer section 4 epitaxially on the GaAs single crystal substrate 61 is bonded to the Si single crystal substrate 2 with the metal layer 3 interposed therebetween and thereafter the GaAs single crystal substrate 61 is removed, a bow in some cases occurs in the light emitting substrate thus obtained as shown in FIG. 9(b). A cause for generating a bow is as follows: That is, as shown in FIG. 10A, an elastic strain associated with lattice mismatching between the GaAs single crystal substrate 61 and the AlGaAs current spreading layer 44 grown epitaxially thereon, arises in the AlGaAs current spreading layer 44. To be concrete, since a lattice constant of AlAs is a little larger than that of GaAs, an elastic strain in a compression direction in a crystal lattice plane arises in the AlGaAs current spreading layer 44. When the GaAs single crystal substrate 61 is removed, the elastic strain in the AlGaAs current spreading layer 44 is released so as to extend a lattice in a direction in the lattice plane, with the result that a bow occurs as shown in FIG. 9(b) so as to be convex to the AlGaAs current spreading layer 44 side in the light emitting element substrate. If such a bow occurs, there arises a case where cracking is introduced into the light emitting layer, which is not preferable.

Figure 10B:
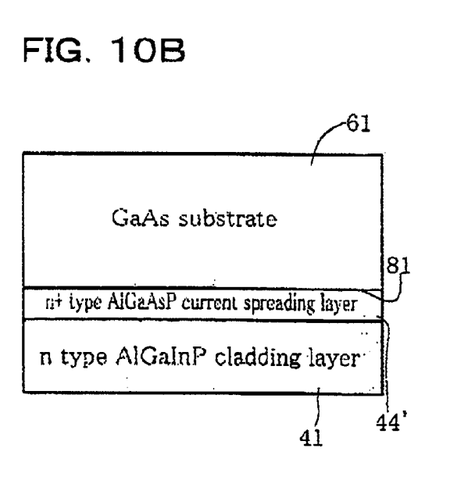

The current spreading layer 44 of the n type in which a majority carriers are electrons can obtain a sufficient current spreading effect with a smaller thickness than the layer 44 of the p type in which a majority carriers are holes each having a larger effective mass. Therefore, the AlGaAs current spreading layer obtained by epitaxial growth on the GaAs single crystal substrate 61 can be thinner in a case of the n type (44'), as shown in FIG. 10B, than in a case of the p type (44), as shown in FIG. 10A. If a thickness of the AlGaAs current spreading layer is smaller, an elastic strain energy to be released when the GaAs single crystal substrate 61 is removed is also smaller and a bow of the substrate observed as a result of a work by the released energy can be thereby smaller. That is, with a structure in which the first conductivity cladding layer and the current spreading layer are both of the n type adopted, a bow arising in the light emitting element substrate can be alleviated.

A thickness of the current spreading layer 44' of n type AlGaAs mixed crystal or AlGaAsP mixed crystal doped at a high concentration is preferably in the range of 10 nm to 1000 nm. Thickness values of the other layers can be values similar to the light emitting element 1 of FIG. 2.

Note that by properly selecting a composition of the current spreading layer 44 to increase a valence band discontinuity between the current spreading layer 44 and the cladding layer adjacent thereto, a current spreading effect at the heterojunction interface in the light emitting layer section 4 can be enhanced. In this case, a thickness of the current spreading layer 44 can be smaller, which is effective for prevention of bow generation in the light emitting element substrate.

Figure 8:
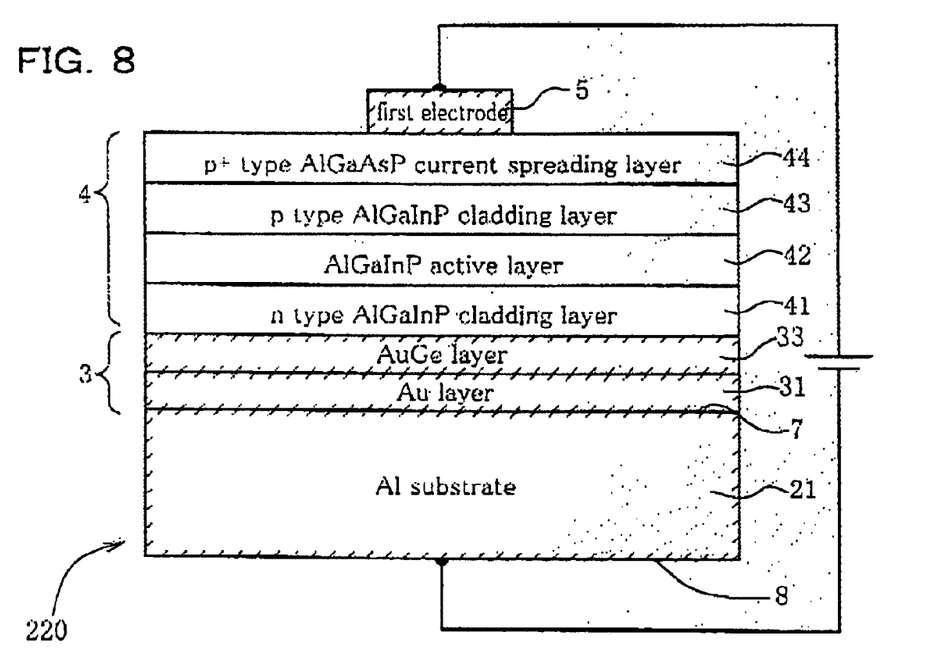
FIG. 8 is a model diagram showing an example of a light emitting element using a metal substrate.

Then, as shown in FIG. 8, a metal can also be used as a material of a conductive substrate instead of a semiconductor such as Si single crystal or the like. In the light emitting element 220 shown in FIG. 8, the Al substrate 21 is used as the conductive substrate 2. As the metal layer 3, a two layer structure is adopted in which the Au layer 31 is disposed in the Al substrate 21 side and the Au—Ge alloy layer 33 is disposed in the light emitting layer section 4 side. The second electrode can be omitted by using a metal as the conductive substrate. Note that properties of the metal used as the conductive substrate 2 can also be obtained from Sn in use instead of Al.

Note that while in the embodiment shown in FIGS. 4 to 11, the current spreading layer is made of an AlGaAs mixed crystal, an AlGaAsP mixed crystal may be used similarly to FIG. 2.

Figure 12:
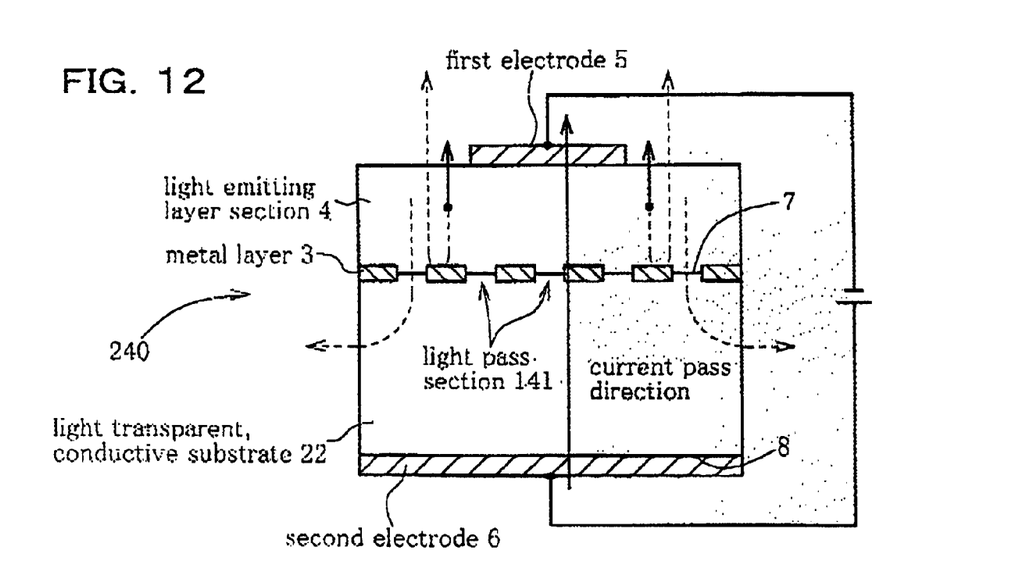
FIG. 12 is a model diagram showing an example of a light emitting element, using light transparent, conductive substrate and having a light passing section formed in a metal layer thereof, together with a function of the light pass section.

Moreover, while in the embodiment described above, the conductive substrate 2 is made of a material having substantially no light transparency such as Si single crystal or a metal, it can be made of a material having light transparency as in a case of the light emitting element 240 shown on FIG. 12. In this case, a light pass section 141 can be formed in the metal layer 3. With the light pass section 141 provided, as external quantum efficiency can be enhanced by both contributions of reflected light on the metal layer 3 and transmitted light directed into the light transparent, conductive substrate 22 side through the light pass section 141. In this case, if the second main surface 8 of the light transparent, conductive substrate 22 is covered with the metal second electrode 6, there can also be expected contribution of reflected light on the surface of the second electrode 6 to improvement on external quantum efficiency. As the light transparent, conductive substrate 22, there can be used, for example, a GaP substrate. Furthermore, a stacked layer structure including the light emitting layer section 4 and the metal layer can be similar to FIGS. 2, 7 and 11 except that the light pass section 141 is formed in the metal layer 3.

Figure 13A:
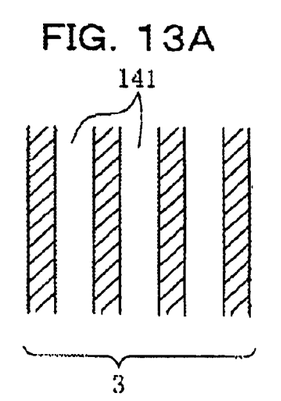
FIGS. 13A to 13C are model diagrams showing various patterns of a light passing section formed in a metal layer.
Figure 13B:
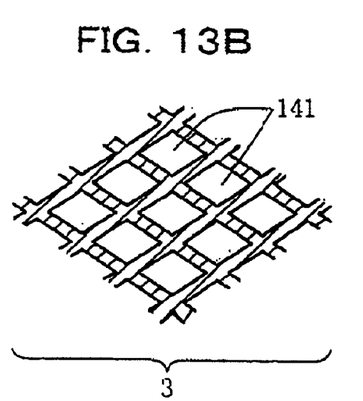
Figure 13C:
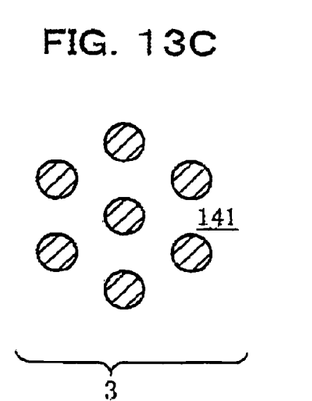

In order to form the light pass section 141 in the metal layer 3, a method can be adopted in which the metal layer 3 is patterned by means such as masking or the like in layer formation. For example, as shown in FIG. 13A, the metal layer 3 can be patterned in an arrangement of straight line segments as to form the light pass section 141 as slits between metal layer regions, each of which shape is a straight line, disposed in parallel to each other. Moreover, as shown in FIG. 13B, the metal layer 3 can also be patterned in a mesh so as form the light pass section 141 as square holes in the mesh. Still moreover, as shown in FIG. 13C, if the metal layer is patterned as distributed dotes or islands, surrounding areas around the individual metal layer regions can b used as the light pass section 141.

What is claimed is:

1. A light emitting element comprising a conductive substrate, a metal layer, a light emitting layer section and a first electrode, wherein the metal layer, the light emitting layer section and the first electrode are formed in the order on the first main surface side of the conductive substrate and a current can be applied to the light emitting layer section through the first electrode and the conductive substrate;

wherein the conductive substrate is a silicon single crystal substrate and a second electrode is formed on a second main surface side of the silicon single crystal substrate;

wherein the metal layer is formed in direct contact with the silicon single crystal substrate;

wherein the metal layer includes a first metal layer in contact with the silicon single crystal substrate and a second metal layer in contact with the light emitting layer section;

and wherein the metal layer further includes an intermediate metal layer in contact with the first metal layer between the first metal layer and the second metal layer, and the first metal layer is made of a metal whose metal component as a main component as a main component is easier to be alloyed with silicon than a metal component as a main component of the intermediate metal layer.

2. The light emitting element according to claim 1, wherein the metal layer is made of a metal including Au as a main component.

3. The light emitting element according to claim 1, wherein the first metal layer is made of a metal whose metal component as a main component has a lower eutectic temperature of a solid solution with silicon than a metal component as a main component of the intermediate metal layer.

4. The light emitting element according to claim 3, wherein the first metal layer is made of a metal including Au as a main component and the intermediate layer is made of a metal including Al as a main component.

5. The light emitting element according to claim 1, wherein the second metal layer is made of a metal including Au as a main component.

6. The light emitting element according to claim 1, wherein the second metal layer is made of a metal including Au as a main component.

7. The light emitting element according to claim 1, wherein the conductive substrate is made of a material having light transparency and a light pass section is formed in the metal layer.

8. The light emitting element according to claim 7, wherein the conductive substrate having light transparency is a GaP substrate.

9. The light emitting element according to claim 1, wherein the light emitting layer section has a double heterostructure layer including: a first conductivity type cladding layer located in the first electrode side; a second conductivity type cladding layer located in the metal layer side; and an active layer formed between the first conductivity type cladding layer and the second conductivity type cladding layer and further has a first conductivity type current spreading layer formed between the first electrode and the first conductivity type cladding layer.

10. The light emitting element according to claim 9, wherein the first conductivity type cladding layer and the current spreading layer are both of the p type.

11. The light emitting element according to claim 9, wherein the double heterostructure layer is made of AlGaInP mixed crystal and the current spreading layer is made of AlGaAs mixed crystal or AlGaAsP mixed crystal.

12. The light emitting element according to claim 10, wherein the double heterostructure layer is made of AlGaInP mixed crystal and the current spreading layer is made of AlGaAs mixed crystal or AlGaAsP mixed crystal.

13. The light emitting element according to claim 1, wherein the main component of the intermediate metal layer is either of Al, Ag, Cu, Ni, Pd or Pt.

* * * * *

UNITED STATES PATENT AND TRADEMARK OFFICE
CERTIFICATE OF CORRECTION

PATENT NO. : 6,759,689 B2
DATED : July 6, 2004
INVENTOR(S) : Keizo Adomi, Masanobu Takahashi and Nobuhiko Noto It is certified that error appears in the above-identified patent and that said Letters Patent is hereby corrected as shown below:

<u>Column 11,</u>
Line 36, after "as a main component" delete "as a main component"

Signed and Sealed this

Fourteenth Day of December, 2004

JON W. DUDAS
*Director of the United States Patent and Trademark Office*